(12) United States Patent
Matsubara et al.

(10) Patent No.: US 11,835,594 B2
(45) Date of Patent: Dec. 5, 2023

(54) SHORT CIRCUIT DETECTOR AND POWER CONVERTER

(71) Applicant: FUJI ELECTRIC CO., LTD., Kawasaki (JP)

(72) Inventors: Kunio Matsubara, Hino (JP); Ryoga Kiguchi, Tachikawa (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/564,782

(22) Filed: Dec. 29, 2021

(65) Prior Publication Data
US 2022/0268854 A1 Aug. 25, 2022

(30) Foreign Application Priority Data

Feb. 24, 2021 (JP) .................................. 2021-027904
Aug. 3, 2021 (JP) .................................. 2021-127745

(51) Int. Cl.
*H02M 7/537* (2006.01)
*G01R 31/42* (2006.01)

(52) U.S. Cl.
CPC ............ *G01R 31/42* (2013.01); *H02M 7/537* (2013.01)

(58) Field of Classification Search
CPC ....... G01R 31/42; G01R 31/52; H02M 7/537; H02M 1/32; H02M 1/38; H02M 7/003; H02M 7/00; H02M 7/5387; H02M 1/088; H02H 3/08; H02H 7/122
See application file for complete search history.

(56) References Cited

U.S. PATENT DOCUMENTS

2017/0012555 A1  1/2017  Toshiyuki

FOREIGN PATENT DOCUMENTS

| CN | 106341032 B | * | 9/2019 | ......... G01R 19/0092 |
| JP | 2008236907 A | | 10/2008 | |
| JP | 201265483 A | | 3/2012 | |
| JP | 2019216540 A | | 12/2019 | |
| JP | 2020022269 A | * | 2/2020 | |

* cited by examiner

Primary Examiner — Tarun Sinha
Assistant Examiner — James I Burris

(57) ABSTRACT

A short circuit detector is included in a power converter, the power converter being configured to supply power to a load via a first arm including a first semiconductor switch and a second arm including a second semiconductor switch. The short circuit detector includes a Rogowski coil; and a detection circuit configured to detect a short circuit in one of the first arm, the second arm and the load, based on a detection signal obtained from the Rogowski coil. The Rogowski coil is inserted into both: (i) first current path through which a first current flows in common with the first arm and the load, and (ii) a second current path through which a second current flows in common with the second arm and the load.

11 Claims, 13 Drawing Sheets

SHORT CIRCUIT DETECTOR AND POWER CONVERTER

CROSS REFERENCE TO RELATED APPLICATIONS

This Application is based on and claims priority from Japanese Patent Application No. 2021-127745 filed Aug. 3, 2021, which is based on and claims priority from Japanese Patent Application No. 2021-27904, filed Feb. 24, 2021, the entire contents of each of which are incorporated herein by reference.

FIELD OF THE INVENTION

The present disclosure relates to short circuit detectors and to power converters.

DESCRIPTION OF RELATED ART

In a power converter that drives a load such as a motor, an overcurrent may flow through a semiconductor switch included in the power converter. When there is such an overcurrent for a long period of time, the semiconductor switch may be damaged. Therefore, the power converter includes a short circuit detector that detects an overcurrent flowing in the semiconductor switch and then stops the power converter.

In this type of short circuit detector, a shunt resistor, a Current Transformer (CT), or a Rogowski coil is used to detect a current flowing in the semiconductor switch. Among these components, the Rogowski coil does not have a core. This enables the short circuit detector to be smaller and enables a large current to be measured.

The technique disclosed in Patent Document 1 (Japanese Patent Application Laid-Open Publication No. 2019-216540) relates to a power converter that supplies power to a load via arms. The power converter includes arms, each of which includes a semiconductor switch, Rogowski coils, and detection circuits. One arm corresponds to one Rogowski coil and one detection circuit. A detection circuit detects a short circuit in a corresponding power converter and the like, based on an output voltage of a corresponding Rogowski coil.

In the technique disclosed in Patent Document 1, provision of a Rogowski coil and a detection circuit for each of the arms increases cost and size of the power converter. In addition, there are known power converters that include a high-speed semiconductor switch, such as a SiC switch. In such a power converter, when there is a load short circuit, a time gradient di/dt of a short circuit current is on the order of micro-seconds. In an arm short circuit, the time gradient di/dt of the short circuit current is on the order of nano-seconds. For this reason, the optimum number of turns of the Rogowski coil for detecting load and arm short circuits differs greatly in both of these cases. Two detectors are needed for the load short circuit and the arm short circuit, which leads to a large Rogowski coil as well as a large and complicated detection circuit.

SUMMARY

In view of the circumstances described above, the purpose of this disclosure is to provide a technique for detecting a short circuit in a power converter and to avoid increasing the size and complexity of the power converter.

One aspect of a short circuit detector is included in a power converter, the power converter being configured to supply power to a load via a first arm including a first semiconductor switch and a second arm including a second semiconductor switch. The short circuit detector includes: a Rogowski coil; and a detection circuit configured to detect a short circuit in one of the first arm, the second arm and the load, based on a detection signal obtained from the Rogowski coil, and wherein the Rogowski coil is inserted into both: a first current path through which a first current flows in common with the first arm and the load, and a second current path through which a second current flows in common with the second arm and the load.

Another aspect of a power converter that supplies power to a load, includes: a first arm that includes a first semiconductor switch; a second arm that includes a second semiconductor switch; a first current path through which a first current flows in common with the first arm and the load; a second current path through which a second current flows in common with the second arm and the load; and a short circuit detector, in which the short circuit detector includes: a Rogowski coil that is inserted into both the first current path and the second current path; and a detection circuit configured to detect a short circuit in one of the first arm, the second arm and the load, based on a detection signal obtained from the Rogowski coil.

In this aspect, one Rogowski coil and one detection circuit are provided for two arms, thereby detecting a short circuit in a power converter and avoiding increasing the size and the complexity of the power converter.

BRIEF DESCRIPTION OF THE DRAWINGS

FIG. 4 shows circuit diagrams illustrating operations of the power converter at the normal turning-on.

DESCRIPTION OF EMBODIMENT

Figure 1:
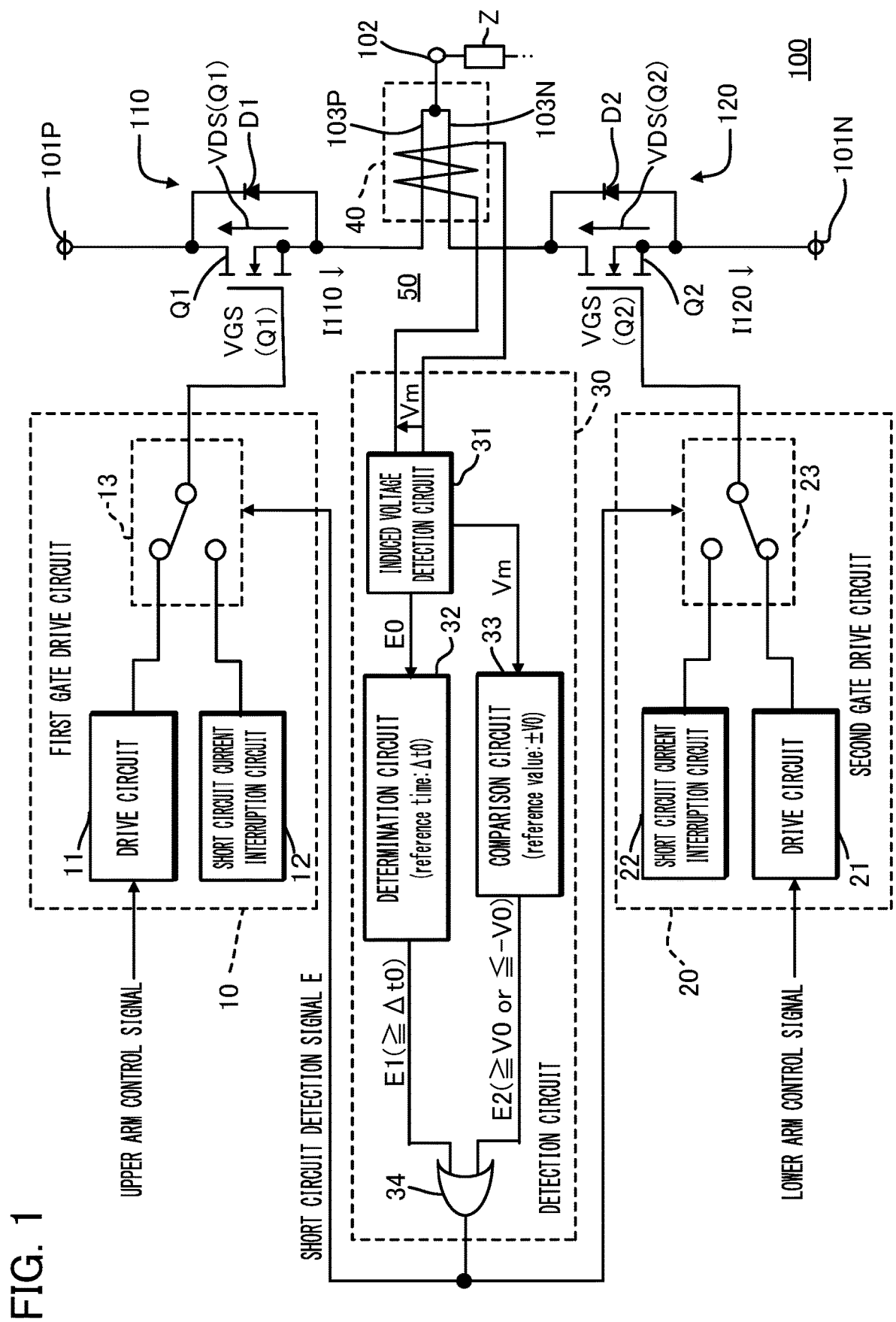
FIG. 1 is a circuit diagram of a power converter including a short circuit detector according to an embodiment.

Description will be given of an embodiment with reference to the drawings. FIG. 1 is a circuit diagram of a power converter 100 including a short circuit detector 50 according to an embodiment. The power converter 100 corresponds to one phase of an inverter. The power converter 100 includes an upper arm 110 (a first arm), a lower arm 120 (a second arm) and an AC output terminal 102. The upper arm 110 and the lower arm 120 are connected in series with each other, and are disposed between a high power line 101P that is connected to the positive end of a power supply (not shown in the drawing) and a low power line 101N that is connected to the negative end of the power supply. The AC output terminal 102 corresponds to a point (a common connection point) at which the two arms are connected in common. The AC output terminal 102 is connected to a load Z, such as a motor winding. The power converter 100 may include upper arms 110 and lower arms 120 for multiple phases. In this case, pairs of series-connected upper arms 110 and lower arms 120 for one phase may be connected in parallel and disposed between the high power line 101P and the low power line 101N. This configuration comprises an inverter.

The upper arm 110 includes a semiconductor switch Q1 (a first semiconductor switch) and a diode D1 that is connected in reverse parallel thereto. Similarly, the lower arm 120 includes a semiconductor switch Q2 (a second semiconductor switch) and a diode D2 that is connected in reverse parallel thereto. Each of the semiconductor switches Q1 and Q2 is a transistor, such as a Metal Oxide Semiconductor Field Effect Transistor (MOSFET). Examples of the transistor include a wide bandgap semiconductor device, the main material of which includes at least one of silicon carbide, gallium nitride, gallium oxide, and diamond.

The power converter 100 includes a first gate drive circuit (for the upper arm) 10 and a second gate drive circuit (for the lower arm) 20. The first gate drive circuit 10 controls turning on and off of the semiconductor switch Q1 of the upper arm 110 based on an upper arm control signal supplied from a controller (not shown in the drawing). The second gate drive circuit 20 controls turning on and off of the semiconductor switch Q2 of the lower arm 120 based on a lower arm control signal supplied from the controller. The power converter 100 supplies AC power to the load Z via the upper arm 110 and the lower arm 120.

In the example of FIG. 1, when there is a short circuit in the upper arm 110, an arm short circuit current flows through both the upper arm 110 and the lower arm 120 when the lower arm 120 is turned on. When there is a short circuit in the lower arm 120, an arm short circuit current flows through both the upper arm 110 and the lower arm 120 when the upper arm 110 is turned on. In the power converter 100, when there is a short circuit in the load Z, a load short circuit current flows through the upper arm 110 or the lower arm 120.

If such an arm short circuit current or a load short circuit current flows through the upper arm 110 or the lower arm 120 over a long period of time, the semiconductor switch Q1 of the upper arm 110 or the semiconductor switch Q2 of the lower arm 120 may be damaged. Therefore, the power converter 100 includes a short circuit detector 50. The short circuit detector 50 detects an arm short circuit or a load short circuit, and then stops the drive of the semiconductor switch Q1 by the first gate drive circuit 10 and the drive of the semiconductor switch Q2 by the second gate drive circuit 20.

The short circuit detector 50 includes a Rogowski coil 40 provided for the upper arm 110 (a first arm) and the lower arm 120 (a second arm), and a detection circuit 30 that detects a short circuit in the power converter 100 based on an induced voltage Vm. The induced voltage Vm refers to a detection signal obtained from the Rogowski coil 40. The detection circuit 30 is also referred to as a short circuit determination circuit.

In the embodiment, the Rogowski coil 40 is inserted in both of two current paths. One is a first current path 103P through which a first current flows in common with the upper arm 110 and the load Z. The other one is a second current path 103N through which a second current flows in common with the lower arm 120 and the load Z. Specifically, the upper arm 110 and the lower arm 120 are connected in series with each other, and are disposed between the high power line 101P and the low power line 101N. The load Z is connected to the AC output terminal 102. The AC output terminal 102 corresponds to a point (a common connection point) at which the upper arm 110 and the lower arm 120 are connected in common. The first current path 103P is between the upper arm 110 and the AC output terminal 102. The second current path 103N is between the lower arm 120 and the AC output terminal 102. A part of the first current path 103P and a part of the second current path 103N are inside the Rogowski coil 40. Inside the Rogowski coil 40, the direction of the current flowing from the upper arm 110 to the load Z via the first current path 103P is identical to that of the current flowing from the load Z to the lower arm 120 via the second current path 103N.

In such a configuration, a current flows in the first current path 103P or the second current path 103N results in a circular magnetic field centered on the current path. In response to a change in the current flow in the two current paths, an induced voltage Vm proportional to the time gradient di/dt of the current is output from the Rogowski coil 40. The induced voltage Vm refers to a detection signal obtained from the Rogowski coil 40.

The detection circuit 30 includes an induced voltage detection circuit 31, a determination circuit 32, a comparison circuit 33, and an OR gate 34.

The induced voltage detection circuit 31 detects an induced voltage (a detection signal) Vm obtained from the Rogowski coil 40, and outputs the detected voltage to the comparison circuit 33. The induced voltage detection circuit 31 outputs a signal E0 in a period during which the induced voltage Vm is zero, specifically in the period during which the absolute value of the induced voltage Vm is less than a small threshold (a first threshold).

The determination circuit 32 detects an arm short circuit based on the signal E0. Specifically, in this embodiment, in some cases, an abnormality, such as a short circuit or an erroneous turning-on, occurs in one of the upper arm 110 or the lower arm 120, which results in an arm short circuit. In this case, when the other arm is turned on, a current having the same value continues to flow through each of the first current path 103P and the second current path 103N for a long time. The polarity of the current in the first current path 103P is opposite to that of the current in the second current path 103N. Then the induced voltage Vm obtained from the Rogowski coil 40 continues to be zero for a long time. Therefore, the determination circuit 32 outputs an arm short circuit detection signal E1 representative of an occurrence of an arm short circuit, when the signal E0 continues for a given reference time Δt0 or longer from the start of the turning-on of the upper arm 110 or the lower arm 120.

The comparison circuit 33 detects a load short circuit based on the induced voltage Vm. Specifically, in this embodiment, when there is a short circuit in the load Z, an larger current than usual flows through the first current path 103P or the second current path 103N. In addition, the current increases with time. Accordingly, a larger induced voltage Vm than usual is output from the Rogowski coil 40. Therefore, the comparison circuit 33 (the detection circuit) outputs a load short circuit detection signal E2, when the absolute value of the induced voltage Vm detected by the induced voltage detection circuit 31 is a reference value V0 (a second threshold) or more.

The OR gate 34 outputs a short circuit detection signal E to the first gate drive circuit 10 and the second gate drive circuit 20, when the arm short circuit detection signal E1 is output or the load short circuit detection signal E2 is output. Then the OR gate 34 (the detection circuit) stops driving the semiconductor switch Q1 and the semiconductor switch Q2.

The first gate drive circuit 10 includes a drive circuit 11, a short circuit current interruption circuit 12, and a switching circuit 13. The drive circuit 11 receives an upper arm control signal for turning on or off the semiconductor switch Q1. When receiving the upper arm control signal representative of "on," the drive circuit 11 outputs a gate-source voltage VGS (Q1) that enables the semiconductor switch Q1 to be on. When receiving the upper arm control signal representative of "off," the drive circuit 11 outputs a gate-source voltage VGS (Q1) that enables the semiconductor switch Q1 to be off. The short circuit current interruption circuit 12 outputs a gate-source voltage VGS (Q1) that enables a short circuit current to flow through the semiconductor switch Q1 to be interrupted. When the short circuit detection signal E is not output, the switching circuit 13 operates such that the gate-source voltage VGS (Q1) output from the drive circuit 11 is applied to the semiconductor switch Q1. When the short circuit detection signal E is output, the switching circuit 13 operates such that the gate-source voltage VGS (Q1) output from the short circuit current interruption circuit 12 is applied to the semiconductor switch Q1.

Similarly to the first gate drive circuit 10, the second gate drive circuit 20 includes a drive circuit 21, a short circuit current interruption circuit 22 and a switching circuit 23. When the short circuit detection signal E is not output, the switching circuit 23 operates such that the gate-source voltage VGS (Q2) output from the drive circuit 21 is applied to the semiconductor switch Q2. When the short circuit detection signal E is output, the switching circuit 23 operates such that the gate-source voltage VGS (Q2) output from the short circuit current interruption circuit 22 is applied to the semiconductor switch Q1.

Figure 2:
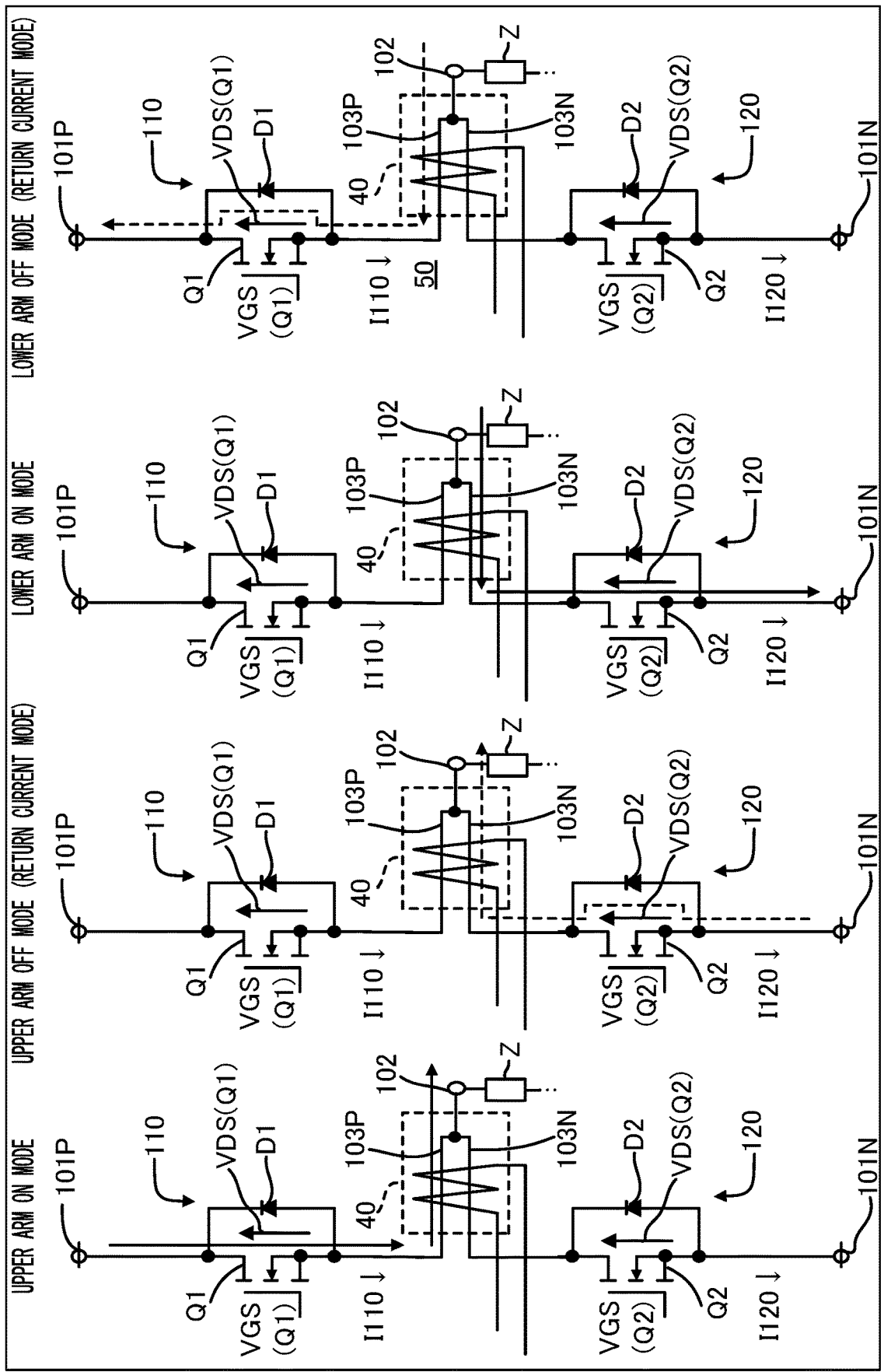
FIG. 2 is a circuit diagram of examples of operations of the power converter.

Next, operations of the power converter will be described. FIG. 2 shows circuit diagrams of examples of general operations of the power converter 100. In the example shown in FIG. 2, power is supplied to the load Z by the following modes.

(1) Upper Arm ON Mode

When the lower arm 120 is off, the upper arm 110, and another lower arm of another phase (not shown in the drawings) are turned on.

(2) Upper Arm OFF Mode (Return Current Mode)

After (1), the upper arm 110 and another lower arm of another phase (not shown in the drawings) are turned off.

(3) Lower Arm ON Mode

The lower arm 120 and another upper arm of another phase (not shown in the drawing) are turned on.

(4) Lower Arm OFF Mode (Return Current Mode)

After (3), the lower arm 120 and another upper arm of another phase (not shown in the drawings) are turned off.

In the upper arm ON mode, a gate-source voltage VGS (Q1) that enables the semiconductor switch Q1 to be on is output from the first gate drive circuit 10. At this time, the semiconductor switch of the lower arm of the other phase (not shown in the drawing) is turned on simultaneously with the semiconductor switch Q1. By the turning-on of the semiconductor switch Q1 and the lower arm of the other phase, an upper arm current I110 (a drain current) flows from the high power line 101P via the semiconductor switch Q1. The upper arm current I110 flows to the load Z through the first current path 103P inside the Rogowski coil 40 (see, solid arrow). In the upper arm ON mode, the upper arm current I110 increases over time, and the upper arm current I110 flows from the upper arm 110 to the load Z through the first current path 103P. In this embodiment, the Rogowski coil 40 is disposed such that the Rogowski coil 40 outputs a positive induced voltage Vm when the current flowing through the semiconductor switch Q1 to the load Z increases.

In the subsequent upper arm OFF mode, a gate-source voltage VGS (Q1) that enables the semiconductor switch Q1 to be turned off is output from the first gate drive circuit 10, and the semiconductor switch Q1 is turned off. At the same time, the lower arm of another phase (not shown in the drawing) is turned off. As a result, an electromotive force is generated by the load Z to maintain the current flowing in the load Z at this time. Then a lower arm current I120 (a return current) flows from the low power line 101N to the load Z through the diode D2 and the second current path 103N inside the Rogowski coil 40 (see dashed arrow).

In the upper arm OFF mode, the lower arm current I120 (a return current) decreases over time. The lower arm current I120 flows from the lower arm 120 to the load Z through the second current path 103N. In other words, in the upper arm OFF mode, the direction of the current flowing through the Rogowski coil 40 is identical to that in the upper arm ON mode, but rate of change in the current is negative. Accordingly, the Rogowski coil 40 outputs a negative induced voltage Vm.

In the subsequent lower arm ON mode, the gate-source voltage VGS (Q2) that enables the semiconductor switch Q2 to be on is output from the second gate drive circuit 20. At this time, the semiconductor switch of another upper arm of another phase (not shown in the drawing), is turned on simultaneously with the semiconductor switch Q2. By turning on the semiconductor switch Q2 and the upper arm of the other phase, a lower arm current I120 (a drain current) flows from the load Z to the low power line 101N via the second current path 103N inside the Rogowski coil 40 and the semiconductor switch Q2 (see solid arrow). In the lower arm ON mode, the lower arm current I120 increases over time, and flows from the load Z to the lower arm 120 through the second current path 103N. In other words, in the lower arm ON mode, a rate of change in the current through the Rogowski coil 40 is identical to that in the upper arm ON mode, but the direction of the current through the Rogowski coil 40 is in the opposite direction. Accordingly, the Rogowski coil 40 outputs a negative induced voltage Vm.

In the subsequent lower arm OFF mode, a gate-source voltage VGS (Q2) that enables the semiconductor switch Q2 to be off is output from the second gate drive circuit 20, and the semiconductor switch Q2 is turned off. At the same time, the upper arm of another phase (not shown in the drawing) also is turned off. As a result, an electromotive force is generated by the load Z to maintain the current flowing in the load Z at this time. Then, an upper arm current I110 (a return current) flows from the load Z to the high power line 101P through the first current path 103P inside the Rogowski coil 40 and the diode D1 (see dashed arrow). In the lower arm OFF mode, the upper arm current I110 decreases over time, and flows from the load Z to the upper arm 110 through the first current path 103P. In other words, in the lower arm OFF mode, the direction of the current passing through the Rogowski coil 40 is opposite to that in the upper arm ON mode, and the rate of change in the current is negative. Accordingly, the Rogowski coil 40 outputs a positive induced voltage Vm.

Figure 3:
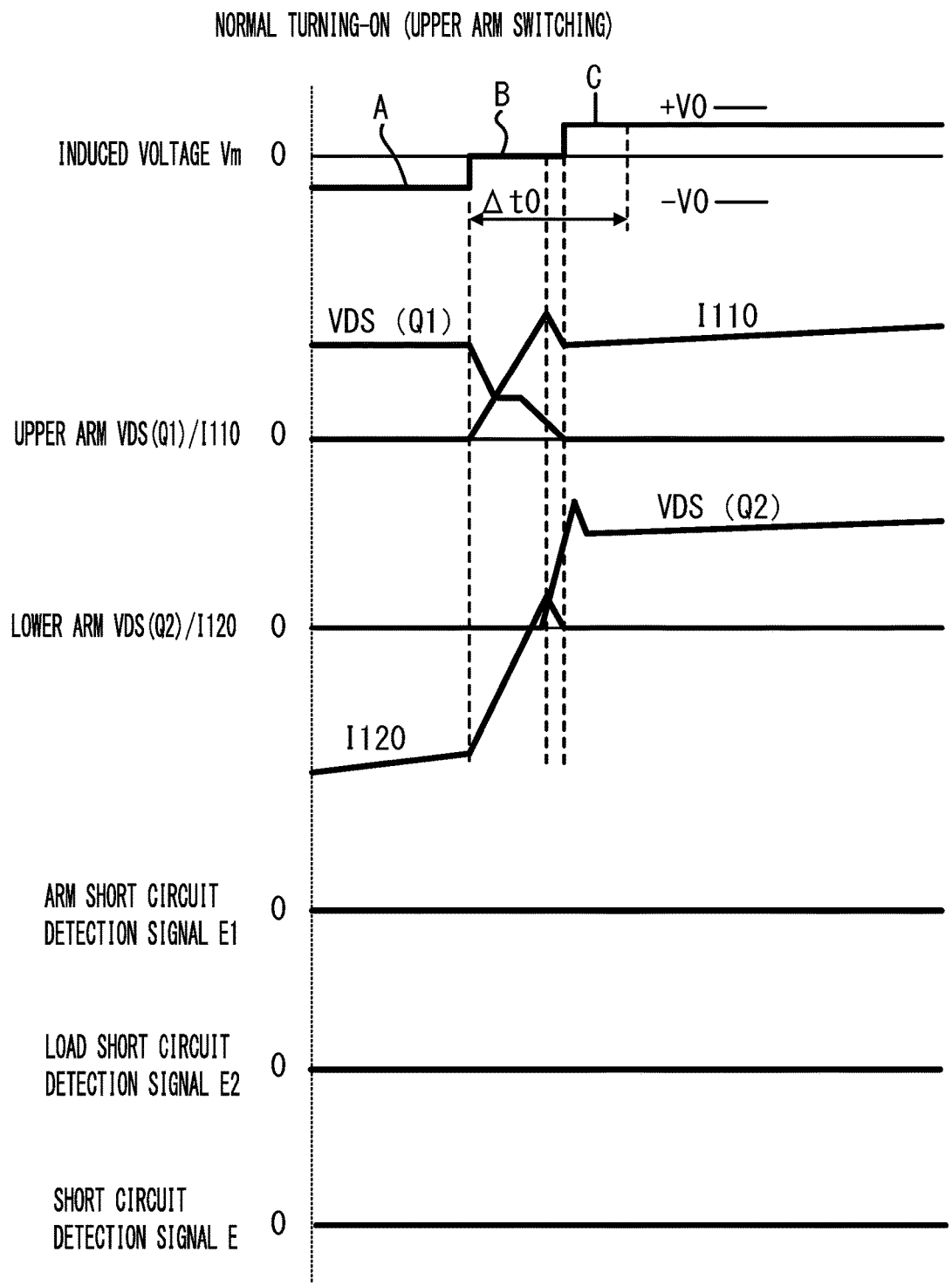
FIG. 3 shows waveforms representative of operations of the power converter in a case in which no short circuit occurs at a switching (normal turning-on).
Figure 4:
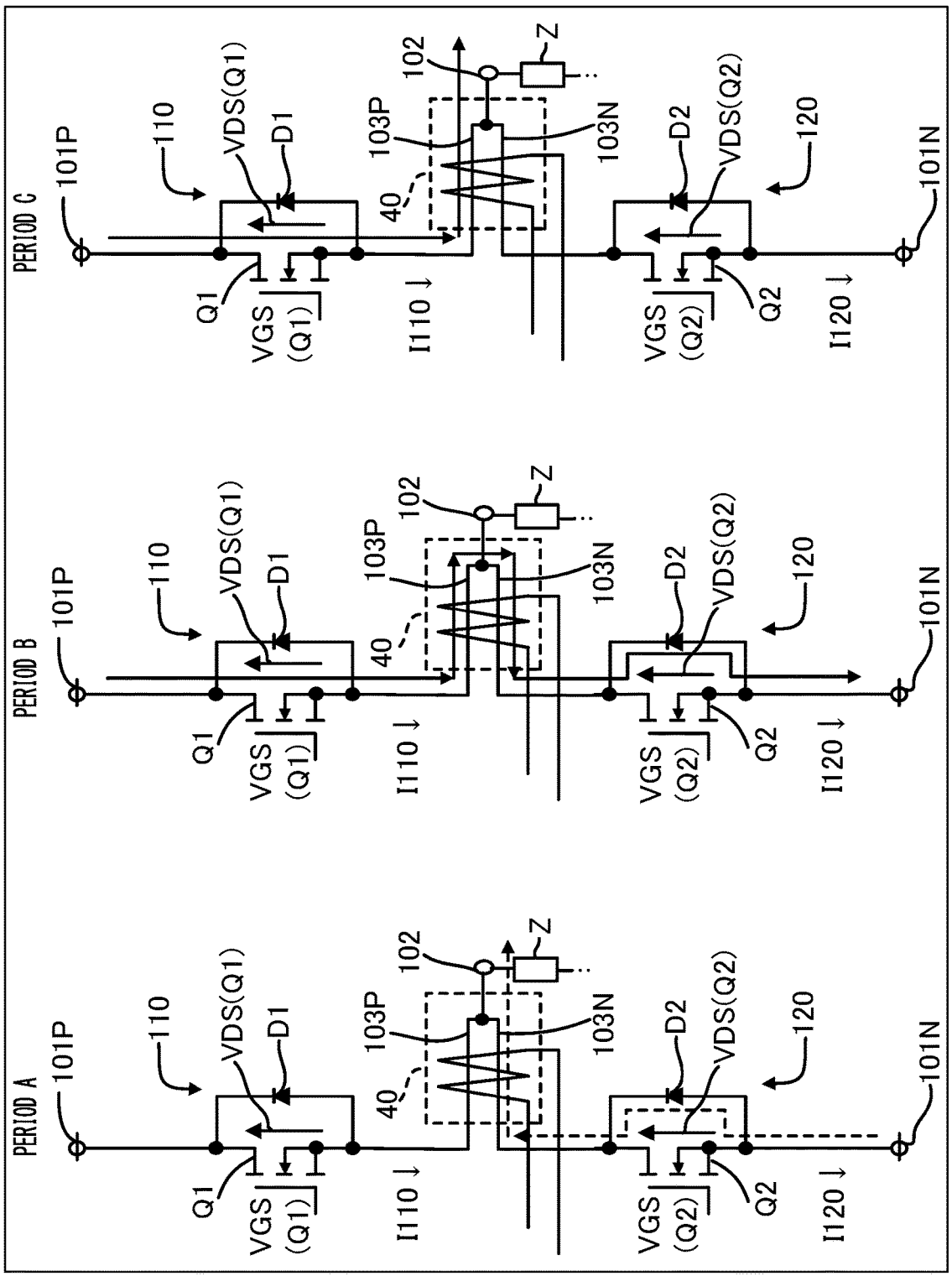

FIG. 3 shows waveforms representative of operations of the power converter 100 in a case in which no short circuit occurs at a switching of the upper arm 110 (normal turning-on). FIG. 4 shows circuit diagrams illustrating operations of the power converter 100 in periods A, B, and C shown in FIG. 3.

In the examples shown in FIGS. 3 and 4, switching of the upper arm 110 is repeated. That is, the upper arm ON mode and the upper arm OFF mode (the return current mode) shown in FIG. 2 are repeated alternatingly. FIGS. 3 and 4 show the upper arm OFF mode and the subsequent upper arm ON mode.

In the example shown in FIG. 3, the boundary between a period A and a period B is the start of a turning-on of the upper arm 110. In the period A before the start of this turning-on, as shown in FIG. 4, a lower arm current I120 (a return current) flows from the low power line 101N to the load Z through the diode D2 and the second current path 103N inside the Rogowski coil 40. Since this mode is the upper arm OFF mode, as shown in FIG. 3, a negative induced voltage Vm is output from the Rogowski coil 40 in the period A.

Thereafter, the upper arm 110 is turned on. In the period B, as shown in FIG. 4, an upper arm current I110 (drain current) flows from the high power line 101P through the semiconductor switch Q1. In the period B, a drain-source voltage VDS (Q1) of the semiconductor switch Q1 decreases over time, and the upper arm current I110 (drain current) increases. At the start of the period B, in the lower arm 120, a return current flows through the diode D2. In the period B, the upper arm current I110 passes through the first current path 103P inside the Rogowski coil 40. Then the upper arm current I110 passes through the second current path 103N and flows to the lower arm 120, thereby decreasing the return current flowing in the diode D2. For this reason, in the period B, a negative lower arm current I120 (return current) reaches zero over time. When the lower arm current (return current) I120 flowing in the diode D2 reaches zero due to the increase in the upper arm current I110, the upper arm current I110 thereafter is a reverse recovery current that enables minority carriers accumulated in the diode D2 during forward bias to be eliminated. In response to this reverse recovery current, the lower arm current I120 reaches a positive peak and then starts to decrease. In this way, the diode D2 changes on to off, and the drain-source voltage VDS (Q2) of the semiconductor switch Q2 of the lower arm 120 increases.

In the period during which the diode D2 changes on to off, the upper arm current I110 which has passed through the first current path 103P flows to the lower arm 120 through the second current path 103N. In other words, a current having the same rate of change flows through each of the first current path 103P and the second current path 103N. The polarity of the current flowing through the first current path 103P is opposite of that flowing through the second current path 103N. In such a case, magnetic fluxes cancel each other in the Rogowski coil 40, and this causes zero voltage to be output from the Rogowski coil 40 as an induced voltage Vm. When the diode D2 is turned off, the upper arm current I110 that has passed through the first current path 103P does not flow to the second current path 103N thereafter, but instead flows to the load Z. This period corresponds to the period C shown in FIG. 3. In the period C, a positive induced voltage Vm is output from the Rogowski coil 40 due to the current mode being the upper arm ON mode.

If there is no arm short circuit, the period during which the zero voltage is generated as the induced voltage Vm is short, and it is determined by characteristics of the diode D2. In the example shown in FIG. 3, the period during which the zero voltage is generated as the induced voltage Vm is shorter than the predetermined reference time Δt0. Accordingly, the arm short circuit detection signal E1 is not output.

If there is no load short circuit, neither upper arm current I110 nor lower arm current I120 flows. Accordingly, the induced voltage Vm obtained from the Rogowski coil 40 is relatively small. In the example shown in FIG. 3, the load short circuit detection signal E2 is not output because the induced voltage Vm obtained from the Rogowski coil 40 is maintained within the range of the predetermined reference value±V0. Accordingly, in the example shown in FIG. 3, no short circuit detection signal E is output.

Figure 5:
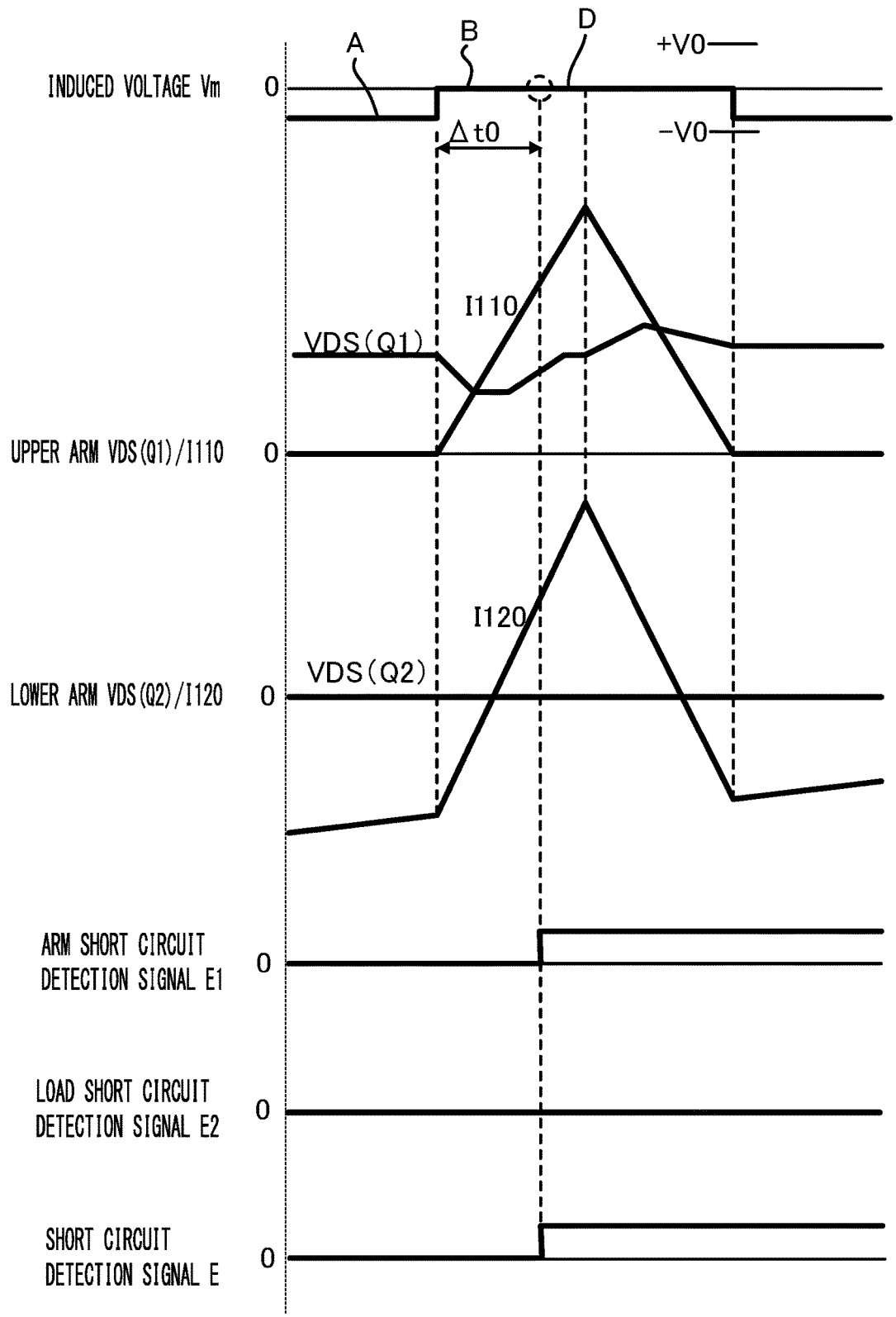
FIG. 5 shows waveforms representative of operations of the power converter in a case in which a short circuit occurs.
Figure 6:
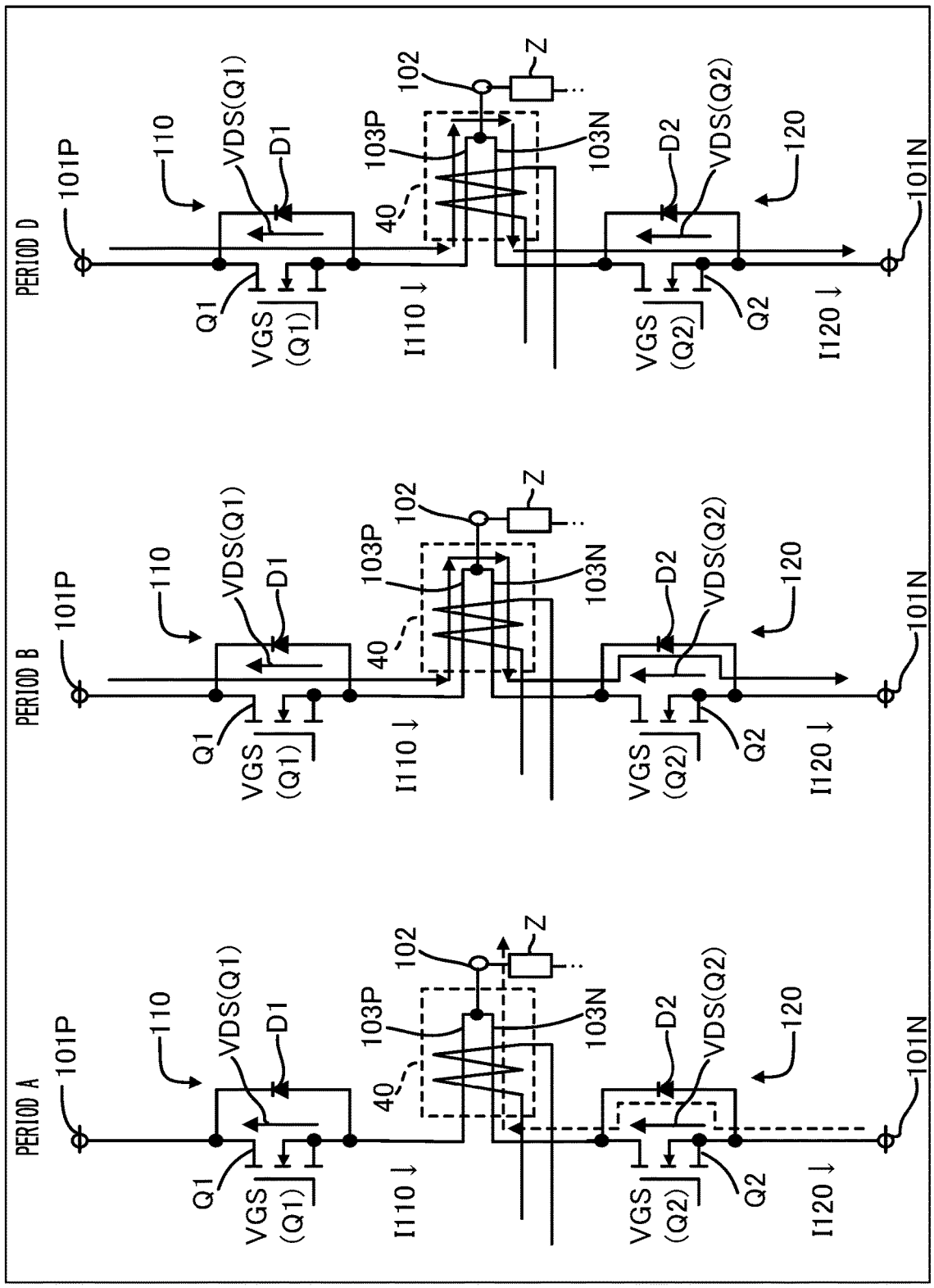
FIG. 6 shows circuit diagrams illustrating operations of the power converter in a case in which a short circuit occurs.

FIG. 5 shows waveforms representative of operations of the power converter 100 in a case in which a short circuit occurs in the lower arm 120 at a switching of the upper arm 110. FIG. 6 shows circuit diagrams illustrating operations of the power converter 100 in the periods A, B and D shown in FIG. 5.

Similar to the examples shown in FIGS. 3 and 4, in the examples shown in FIGS. 5 and 6, a switching of the upper arm 110 is repeated. That is, the upper arm ON mode and the upper arm OFF mode (the return current mode) shown in FIG. 2 are repeated alternatingly.

In the example shown in FIG. 5, the boundary between the period A and the period B is the start of a turning-on of the upper arm 110. The operation of the power converter 100 in the period A is identical to that of the power converter 100 at the normal turning-on (FIGS. 3 and 4).

The upper arm 110 is turned on. In the period B, as shown in FIG. 6, an upper arm current I110 (drain current) flows through the semiconductor switch Q1 from the high power line 101P. Similar to the operation of the power converter 100 at the normal turning-on described above, in the period B, the upper arm current I110 flows through the lower arm 120 via the first current path 103P and the second current path 103N, thereby reducing a return current of the diode D2. Then the upper arm current I110 is the reverse recovery current of the diode D2.

If a short circuit occurs in the semiconductor switch Q2 of the lower arm 120, the upper arm current I110 flows through the semiconductor switch Q2 via the first current path 103P and the second current path 103N in the period B. Here, examples of a short circuit of the semiconductor switch Q2 include a degradation of the semiconductor switch Q2, and a fault that causes the semiconductor switch Q2 to be turned on accidentally due to noise or other factors.

Thus, where there is an arm short circuit of the lower arm 120, two processes occur simultaneously in the period B. One of the two processes is to reduce the return current of diode D2 and then to apply a reverse recovery current to diode D2. The other one is to apply the upper arm current I110 to the semiconductor switch Q2 of the lower arm 120.

For this reason, a current having the same rate of change continues to flow through the first current path 103P and the second current path 103N for a long time. The polarity of the current flowing through the first current path 103P is opposite to that through the second current path 103N. Then the period during which the induced voltage Vm of the Rogowski coil 40 maintains zero voltage exceeds a reference time Δt0, and the arm short circuit detection signal E1 is output. As a result, the short circuit detection signal E is output.

In the first gate drive circuit 10, when the short circuit detection signal E is output, the signal source of a gate-source voltage VGS (Q1) is switched from the drive circuit 11 to the short circuit current interruption circuit 12 by the switching circuit 13. Then the gate-source voltage VGS (Q1) that enables the semiconductor switch Q1 to be off is output from the first gate drive circuit 10. Next, in the second gate drive circuit 20, when the short circuit detection signal E is output, the signal source of the gate-source voltage VGS (Q2) is switched from the drive circuit 21 to the short circuit current interruption circuit 22 by the switching circuit 23. Then the gate-source voltage VGS (Q2) that enables the semiconductor switch Q2 to be off is output from the second gate drive circuit 20

As a result, a period D starts, during which both the upper arm current I110 and the lower arm current I120 decrease. In this embodiment, the arm short circuit current is interrupted by detection of an arm short circuit.

Description has been given of the operations related to the detection of an arm short circuit of the lower arm at a switching of the upper arm. The same operations are used to detect an arm short circuit when a short circuit of the upper arm occurs at a switching of the lower arm. In this case, after the start of a turning-on of the lower arm, a current having the same value flows through each of the first current path 103P and the second current path 103N. The polarity of the current in the first current path 103P is opposite to that of the current in the second current path 103N. The induced voltage Vm of the Rogowski coil 40 is zero voltage for the reference time Δt0 or longer. The induced voltage detection circuit 31 detects an arm short circuit based on the duration of this zero voltage. As described above, the detection circuit 30 detects a short circuit of the upper arm 110 or the lower arm 120 based on the duration of the absolute value of the induced voltage Vm (the detection signal) which is less than a threshold (a first threshold).

Figure 7:
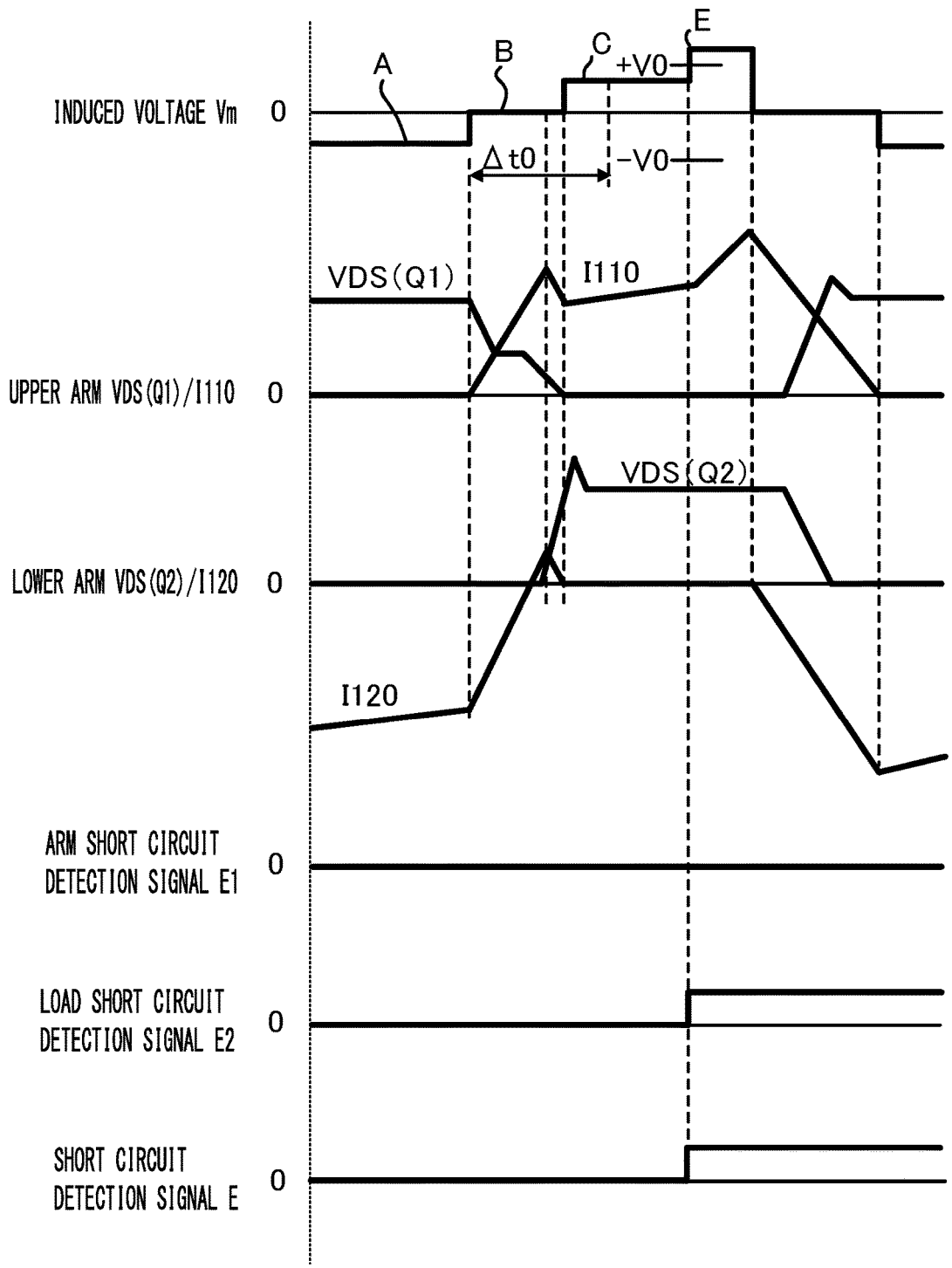
FIG. 7 shows waveforms representative of operations of the power converter in a case in which a short circuit occurs in a load.
Figure 8:
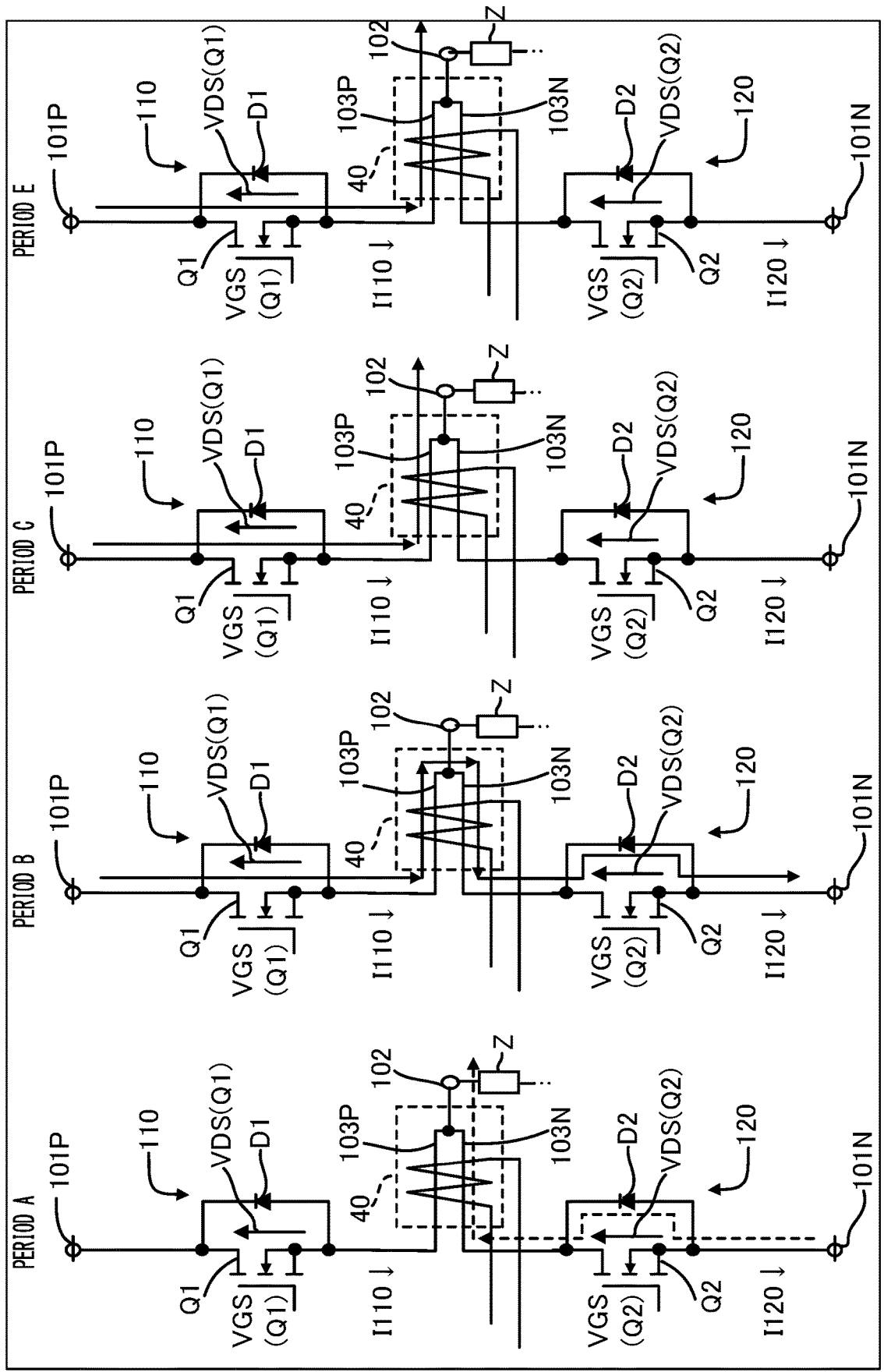
FIG. 8 shows circuit diagrams illustrating operations of the power converter in which a short circuit occurs in the load.

FIG. 7 shows waveforms representative of operations of the power converter 100 in a case in which a short circuit occurs in the load Z at a switching of the upper arm 110. FIG. 8 shows circuit diagrams illustrating operations of the power converter 100 in the periods A, B, C, and E shown in FIG. 7.

Similar to the normal turning-on (see FIGS. 3 and 4), in the examples shown in FIGS. 7 and 8, a switching of the upper arm 110 is repeated. That is, the upper arm ON mode and the upper arm OFF mode (the return current mode) shown in FIG. 2 are repeated alternately.

In the example shown in FIG. 7, the boundary between the period A and the period B is the start of a turning-on of the upper arm 110. Operations of the power converter 100 in the periods A, B, and C are identical to those in the periods A, B, and C at the normal turning-on (FIGS. 3 and 4).

When a short circuit occurs in the load Z, an upper arm current I110 increases over time in period C, and it is excessive. The time gradient di/dt of the upper arm current I110 flowing through the first current path 103P is also excessive. For this reason, the induced voltage Vm of the Rogowski coil 40 is greater than the threshold+V0. As a result, the load short circuit detection signal E2 and the short circuit detection signal E are output, and the period E starts.

In the period E, in accordance with the short circuit detection signal E, a gate-source voltage VGS (Q1) that enables the semiconductor switch Q1 to be turned off is output from the first gate drive circuit 10. In addition, agate-source voltage VGS (Q2) that enables the semiconductor switch Q2 to be turned off is output from the second gate drive circuit 20. As a result, the load short circuit current is interrupted.

In this embodiment, the short circuit detector 50 includes a Rogowski coil 40 and a detection circuit 30. One Rogowski coil 40 is provided for two arms (the upper arm 110 and the lower arm 120). The detection circuit 30 detects a short circuit that occurs in the power converter 100 (in a case of one phase of the inverter, a short circuit of the upper arm 110, a short circuit of the lower arm 120, or a short circuit of the load Z) and interrupts the short circuit current. Accordingly, in this embodiment, a short circuit in the power converter 100 is detected, and the increase of the size and the complexity of the power converter 100 is avoided.

Modifications

One embodiment is described. Modifications are as follows. One or more modifications of the embodiment can be freely combined as long as there is no conflict.

(1) First Modification

Figure 9:
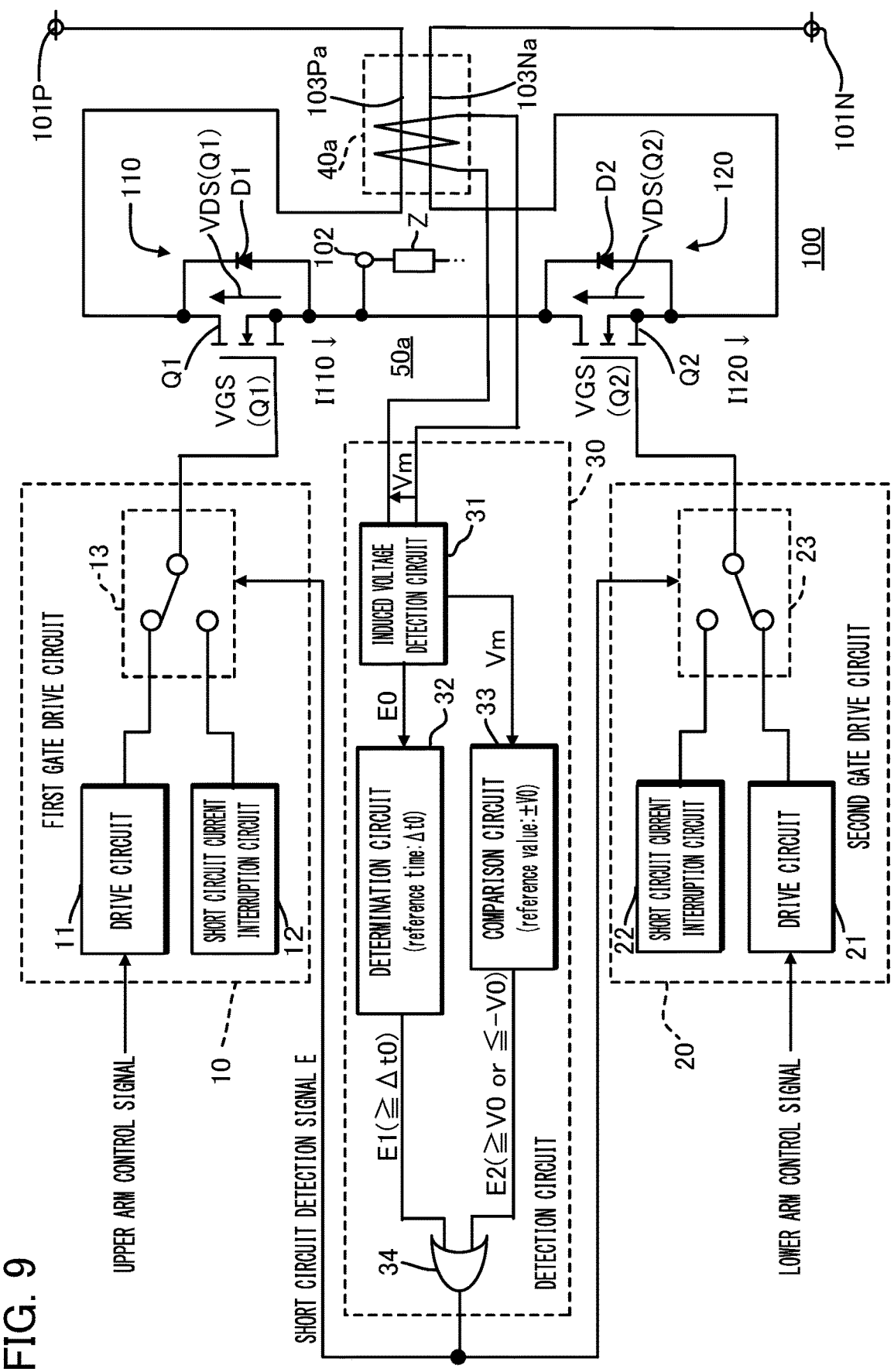
FIG. 9 is a circuit diagram of a power converter that includes a short circuit detector according to a first modification.

FIG. 9 is a circuit diagram of a power converter 100 that includes a short circuit detector 50a according to the first modification. In the short circuit detector 50 according to the embodiment shown in FIG. 1, the Rogowski coil 40 is inside the first current path 103P and the second current path 103N. The first current path 103P is between the upper arm 110 and the AC output terminal 102 (the common connection point for the upper arm 110 and the lower arm 120). The second current path 103N is between the lower arm 120 and the AC output terminal 102. In the short circuit detector 50A shown in FIG. 9, the Rogowski coil 40A is inside a first current path 103Pa and a second current path 103Na. The first current path 103Pa is between the upper arm 110 and the high power line 101P. The second current path 103Na is between the lower arm 120 and the low power line 101N. In the first modification, when there is an arm short circuit, a current having the same value flows through each of the first current path 103Pa and the second current path 103Na. However, the polarity of the current in the first current path 103Pa is opposite to that of the current in the second current path 103Na. In the first embodiment, it enables an arm short circuit to be detected. Furthermore, in the first modification, when there is a load short circuit, an overcurrent, which increases over time, flows through the first current path 103Pa or the second current path 103Na, thereby detecting a load short circuit.

(2) Second Modification

The power converter according to the embodiment may be applied to a power converter other than an inverter that converts DC power into AC power, such as a DC/DC converter and an AC/AC converter.

(3) Third Modification

In the aforementioned embodiment, a MOSFET is given as an example of a semiconductor switch. However, the semiconductor switch is not limited thereto, and may be a semiconductor switch, such as an Insulated Gate Bipolar Transistor (IGBT).

(4) Fourth Modification

In the aforementioned embodiment, the reference time $\Delta t0$ and the reference value $\pm V0$ may be adjusted by a user operation.

(5) Fifth Modification

A host device may be provided to control the power converter 100. In this case, the power converter 100 may receive an active-level control signal from the host device during the supply period of the upper arm control signal and the lower arm control signal. During other periods, the power converter 100 may receive an inactive-level control signal. The logical product of this control signal and the short circuit detection signal E may be supplied to the switching circuit 13 or 23. When the semiconductor switches Q1 and Q2 are off, the induced voltage Vm of the Rogowski coil 40 may exceed the reference time $\Delta t0$ and zero voltage may be maintained. In this case, the switching circuit 13 prevents the connection destination of the gate of the semiconductor switch Q1 from being switched from the drive circuit 11 to the short circuit current interruption circuit 12. The same applies to the switching circuit 23.

(6) Sixth Modification

Figure 10:
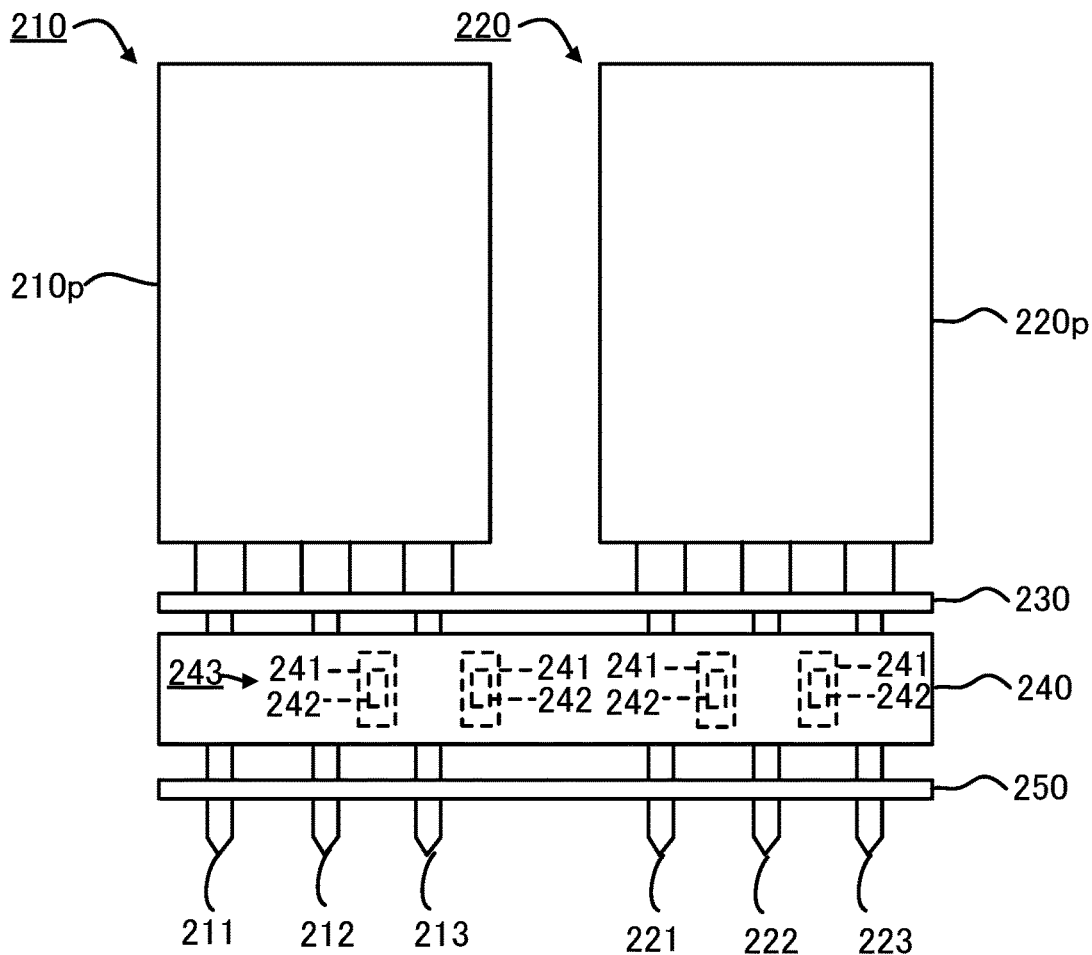
FIG. 10 is a side view of a power converter according to a sixth modification.

FIG. 10 is a side view of a power converter according to a sixth modification. In the example of FIG. 10, the semiconductor module 210 includes a package 210p and three terminals 211 to 213 that protrude from the bottom of the package 210p. The semiconductor module 220 includes a package 220p and three terminals 221 to 223 that protrude from the bottom of the package 220p. The upper arm 110 shown in FIG. 1 is placed inside the package 210p. The upper arm 110 includes the semiconductor switch Q1 and the diode D1 connected in reverse parallel thereto. Here, the terminal 211 is connected to the gate of the semiconductor switch Q1. The terminal 212 is connected to the drain of the semiconductor switch Q1. The terminal 213 is connected to the source of the semiconductor switch Q1. The lower arm 120 shown in FIG. 1 is placed inside the package 220p. The lower arm 120 includes the semiconductor switch Q2 and the diode D2 connected in reverse parallel thereto. Here, the terminal 221 is connected to the gate of the semiconductor switch Q2. The terminal 222 is connected to the drain of the semiconductor switch Q2. The terminal 223 is connected to the source of the semiconductor switch Q2.

All of the terminals (211 to 213 and 221 to 223) are arranged at an interval in a straight line. Each of these terminals extends in one direction and penetrates a gate wiring board 230, a Rogowski wiring board 240, and a main circuit wiring board 250.

On the gate wiring board 230 are disposed the first gate drive circuit 10, the second gate drive circuit 20, and the detection circuit 30 shown in FIG. 1. The gate wiring board 230 includes a conductor pattern that receives a supply of an output signal of the first gate drive circuit 10. The terminal 211 is connected to this conductor pattern. Similarly, the gate wiring board 230 includes a conductor pattern that receives a supply of an output signal of the second gate drive circuit 20. The terminal 221 is connected to this conductor pattern.

The main circuit wiring board 250 includes a conductor pattern that corresponds to the high power line 101P shown in FIG. 1. The terminal 212 is connected to this conductor pattern. The main circuit wiring board 250 includes a conductor pattern that corresponds to the low power line 101N shown in FIG. 1. The terminal 223 is connected to this conductor pattern. Similarly, the main circuit wiring board 250 includes a conductor pattern that corresponds to the AC output terminal 102 shown in FIG. 1. The terminals 213 and 222 are connected to this conductor pattern. In this example, the terminal 213 corresponds to the first current path 103P shown in FIG. 1. The terminal 222 corresponds to the second current path 103N shown in FIG. 1.

Figure 11:
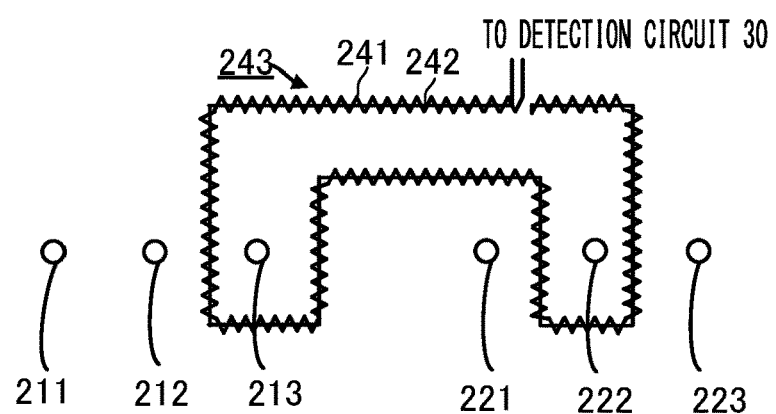
FIG. 11 is a plan view of a Rogowski wiring board according to the sixth modification.

On the Rogowski wiring board 240 is disposed a Rogowski coil 243, which corresponds to the Rogowski coil 40 shown in FIG. 1. FIG. 11 is a plan view of the Rogowski wiring board 240 viewed from the top of the semiconductor modules 210 and 220. As shown in FIG. 11, the Rogowski coil 243 includes a spiral coil 241 that has a start and an end, and a return wire 242 that has a first end and a second end. The first end of the return wire 242 is connected to the end of the spiral coil 241, and the second end of the return wire 242 returns to the start of the spiral coil 241 through the inside of the spiral coil 241. The terminals 213 and 222 (i.e., the first current path 103P and the second current path 103N shown in FIG. 1) are surrounded by the Rogowski coil 243. The star of the spiral coil 241 and the second end of the return wire 242 are connected to the detection circuit 30 on the gate wiring board 230 via through-hole wirings (not shown in the drawing).

The sixth modification provides the same effect as that of the embodiment shown in FIG. 1. In the sixth modification, the Rogowski wiring board 240 on which the Rogowski coil 243 is disposed and the gate wiring board 230 are separated from each other. However, these boards may be unitary. The same applies to the seventh modification (see FIGS. 12 and 13) described below.

(7) Seventh Modification

Figure 12:
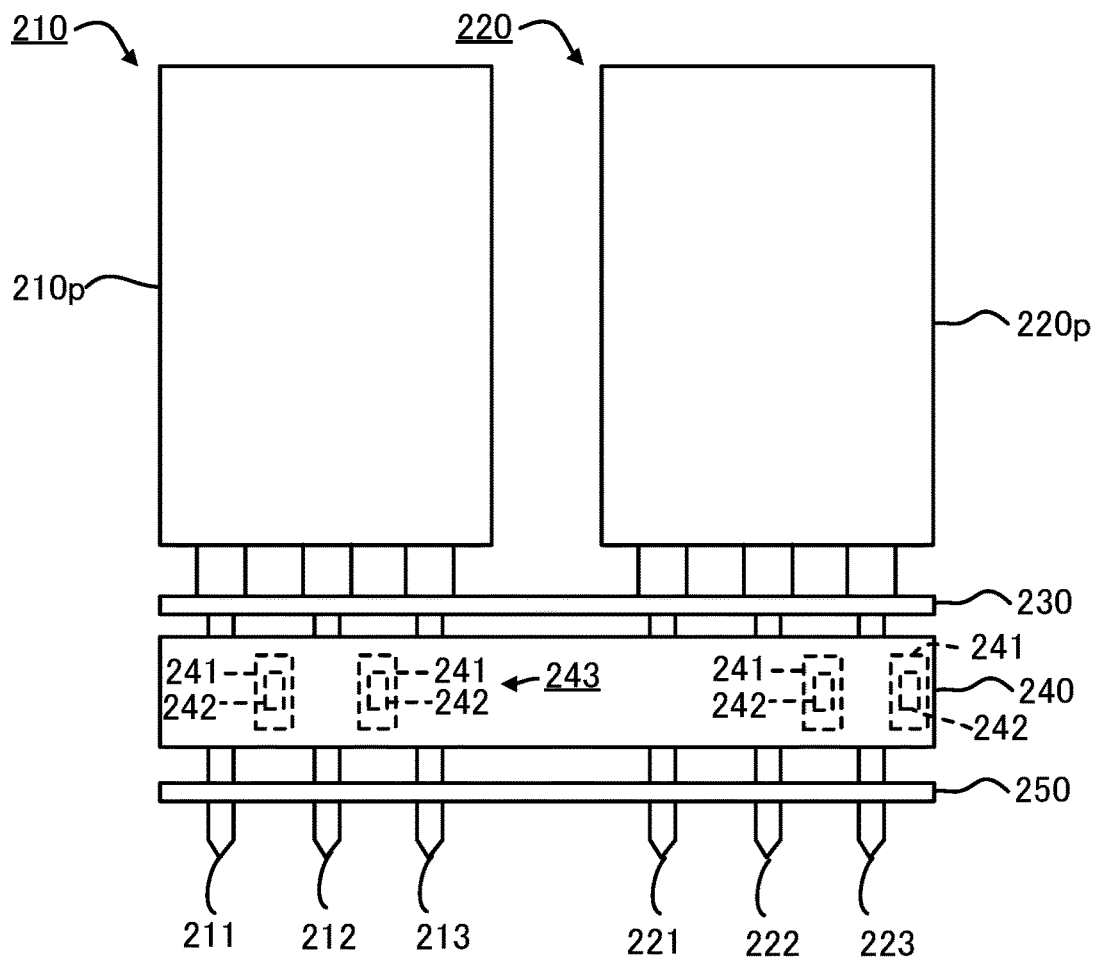
FIG. 12 is a side view of a power converter according to a seventh modification.
Figure 13:
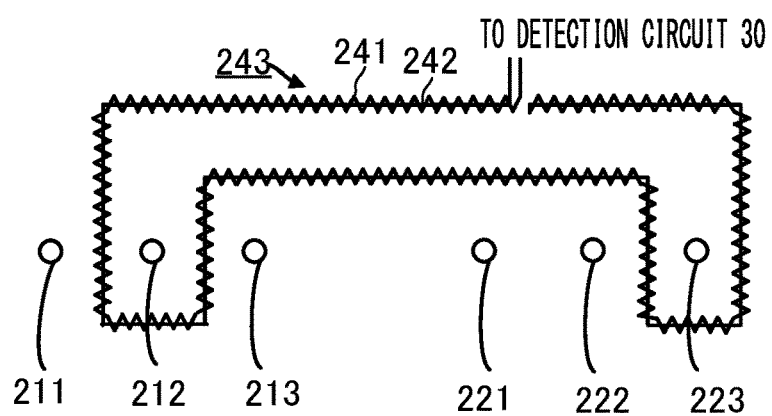
FIG. 13 is a plan view of a Rogowski wiring board according to the seventh modification.

FIG. 12 is a side view of a power converter according to the seventh modification. Similar to the sixth modification shown in FIGS. 10 and 11, the power converter includes the semiconductor modules 210 and 220, the gate wiring board 230, the Rogowski wiring board 240, and the main circuit wiring board 250. FIG. 13 is a plan view of the Rogowski wiring board 240 viewed from the top of the semiconductor modules 210 and 220.

The seventh modification differs from the sixth modification shown in FIGS. 10 and 11 as follows: In the sixth modification, the terminals 213 and 222 (i.e., the first current path 103P and the second current path 103N shown in FIG. 1) are surrounded by the Rogowski coil 243 disposed on the Rogowski wiring board 240. In contrast, in the seventh modification shown in FIGS. 12 and 13, the terminals 212 and 223 (i.e., the first current path 103Pa and the second current path 103Na shown in FIG. 9) are surrounded by the Rogowski coil 243 disposed on the Rogowski wiring board 240.

In the seventh modification, it provides the same effect as that of the first modification shown in FIG. 9.

(8) Eighth Modification

Figure 14:
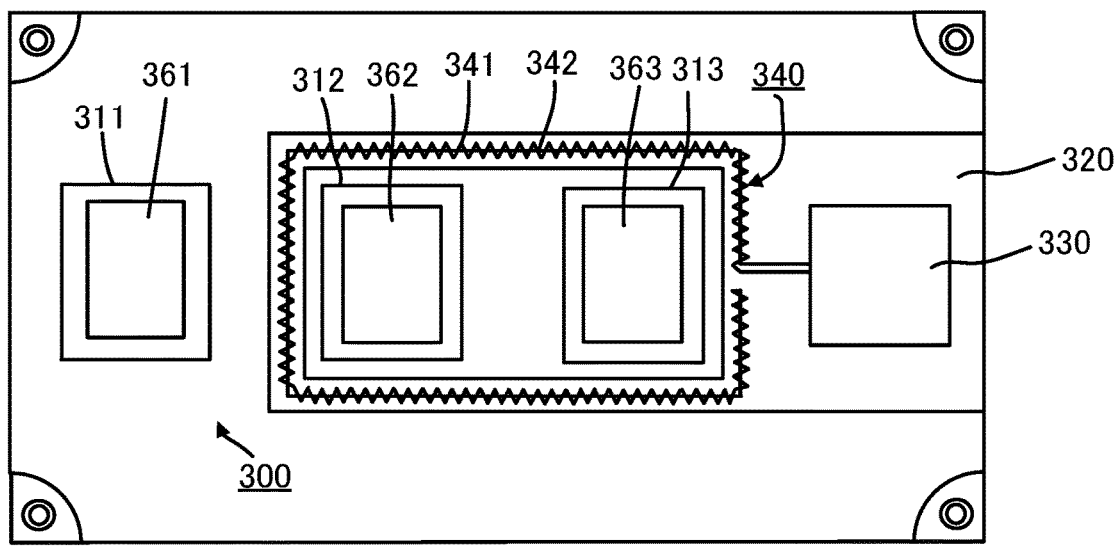
FIG. 14 is a plan view of a power converter according to an eighth modification.
Figure 15:
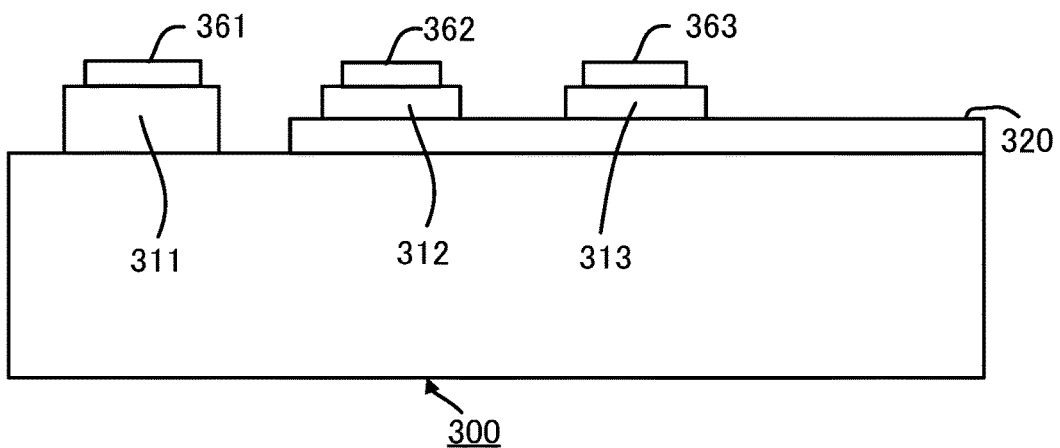
FIG. 15 is a side view of the power converter according to the eighth modification.

FIG. 14 is a plan view a power converter according to the eighth modification. FIG. 15 is a side view of the power converter according to the eighth modification. In the examples shown in FIGS. 14 and 15, a semiconductor module 300 is a two-in-one semiconductor module, and includes elements for each of the upper arm 110 and lower arm 120 shown in FIG. 9. On the top surface of the semiconductor module 300 are disposed insulator spacers 311, 312 and 313. At the top of each of the spacers 311, 312 and 313 are disposed the terminal portions 361, 362 and 363, respectively. In addition, a circuit board 320 is disposed on the spacers 312 and 313. A drive control circuit section 330 is mounted on the circuit board 320. The drive control circuit section 330 includes the first gate drive circuit 10, the second gate drive circuit 20, and the detection circuit 30 shown in FIG. 9.

In the semiconductor module 300, the source of the semiconductor switch Q1 included in the upper arm 110 and the drain of the semiconductor switch Q2 included in the lower arm 120 are connected in common, and this common connection point is connected to the terminal portion 361. In other words, the terminal portion 361 corresponds to the AC output terminal 102 shown in FIG. 9 and is connected to a load not shown in FIG. 14.

In the semiconductor module 300, the drain of the semiconductor switch Q1 include in the upper arm 110 is connected to the terminal portion 362. The terminal portion 362 corresponds to the high power line 101P shown in FIG. 9. In other words, in this example, the semiconductor switch Q1 of the upper arm 110 is inside the semiconductor module 300. The wiring that connects the terminal portion 362 to the drain of the semiconductor switch Q1 corresponds to the first current path 103Pa shown in FIG. 9.

In the semiconductor module 300, the source of the semiconductor switch Q2 included in the lower arm 120 is connected to the terminal portion 363. The terminal portion 363 corresponds to the low power line 101N shown in FIG. 9. In other words, in this example, the semiconductor switch Q2 of the lower arm 120 is inside the semiconductor module 300. The wiring that connects the terminal portion 363 to the source of the semiconductor switch Q2 corresponds to the second current path 103Na shown in FIG. 9.

As shown in FIG. 14, the circuit board 320 includes a Rogowski coil 340 that circles around two current paths. One of the two current paths is the first current path 103Pa from the semiconductor module 300 to the terminal portion 362. The other one is the second current path 103Na from the semiconductor module 300 to the terminal portion 363. The Rogowski coil 340 includes a spiral coil 341 that has a start and an end, and a return wire 342 that has a first end and a second end. The first end of the return wire 342 is connected to the end of the spiral coil 341, and the second end of the return wire 342 returns to the start of the spiral coil 341 through the inside of the spiral coil 341.

The eighth modification provides the same effects as those of the first modification shown in FIG. 9. Furthermore, in the eighth modification, the terminal portion 362 corresponding to the high power line 101P, and the terminal portion 363 corresponding to the low power line 101N are adjacent to each other as shown in FIG. 14. Since the first current path 103Pa connected to the terminal portion 362 and the second current path 103Na connected to the terminal portion 363 are surrounded by the Rogowski coil 340, the configuration of semiconductor modules is simplified.

(9) Ninth Modification

In the aforementioned modifications, the Rogowski coil is disposed outside the semiconductor modules. However, the Rogowski coil may be embedded inside the semiconductor module.

Figure 16:
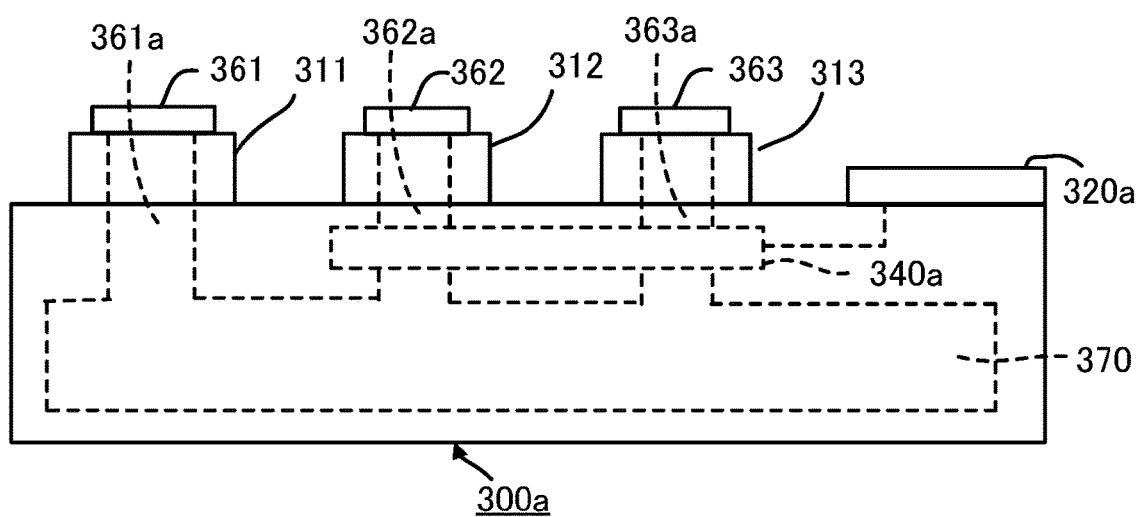
FIG. 16 is a side view of a power converter according to a ninth modification.

FIG. 16 is a side view of a power converter according to the ninth modification. In FIG. 16, the same reference signs are used for elements corresponding to those shown in FIGS. 14 and 15, and detailed description thereof are omitted.

In the ninth modification shown in FIG. 16, a circuit board 320a corresponds to the circuit board 320 shown in FIG. 14, and it does not include the Rogowski coil 340 shown in FIG. 14. Instead, the Rogowski coil 340a is embedded in a semiconductor module 300a, and is connected to the drive control circuit section 330 (see FIG. 14) of the circuit board 320a.

Specifically, in the example of FIG. 16, the semiconductor module 300a includes an element region 370. The element region 370 is inside the semiconductor module 300a and is an area in which elements of each of the upper arm 110 and the lower arm 120 shown in FIG. 9 are disposed. In the element region 370, the source of the semiconductor switch Q1 included in the upper arm 110 and the drain of the semiconductor switch Q2 included in the lower arm 120 are connected in common, and this common connection point is connected to the terminal portion 361 via a conductor layer 361a.

In the element region 370, the drain of the semiconductor switch Q1 included in the upper arm 110 is connected to the terminal portion 362 via a conductor layer 362a. In other words, in this example, the semiconductor switch Q1 is inside the semiconductor module 300a. The conductor layer 362a is a layer that connects the terminal portion 362 to the drain of the semiconductor switch Q1, and corresponds to the first current path 103Pa shown in FIG. 9.

In the element region 370, the source of the semiconductor switch Q2 included in the lower arm 120 is connected to the terminal portion 363 via the conductor layer 363a. In other words, in this example, the semiconductor switch Q2 is inside the semiconductor module 300a. The conductor layer 363a is a layer that connects the terminal portion 363 to the source of the semiconductor switch Q2, and corresponds to the second current path 103Na in FIG. 9. In the example shown in FIG. 16, in addition to the upper arm 110 and the lower arm 120, the first current path 103Pa and the second current path 103Na are placed inside the semiconductor module 300.

In the example of FIG. 16, a Rogowski coil 340a is embedded in the semiconductor module 300a, and circles around the conductor layers 362a and 363a (i.e., the first current path 103Pa and the second current path 103Na). Various methods are available to embed the Rogowski coil 340a in the semiconductor module 300a. For example, a space that circles around the first current path 103Pa and the second current path 103Na may be defined, and the Rogowski coil 340a may be disposed in this space. Alternatively, the Rogowski coil 340a may be disposed in the semiconductor module 300a, and the Rogowski coil 340a may circle around the first current path 103Pa and the second current path 103Na. Thereafter, the semiconductor module 300a may be sealed by an insulating material such as resin.

In the ninth modification, it provides the same effect as that of the eighth modification shown in FIGS. 14 and 15. Furthermore, in the ninth modification, the Rogowski coil 340a is embedded in the semiconductor module 300a. This enables the short circuit detector to be simply mounted in the power converter, as compared to the eighth modification shown in FIGS. 14 and 15. In addition, as compared to the eighth modification shown in FIGS. 14 and 15, the ninth modification enables the creepage distance between the spacers 311 and 312, as well as the creepage distance between the spacers 312 and 313 to be suppressed.

DESCRIPTION OF REFERENCE SIGNS

100 . . . power converter, 101P . . . high power line, 101N . . . low power line, 110 . . . upper arm, 120 . . . lower arm, Q1, Q2 . . . semiconductor switch, D1, D2 . . . diode, 10 . . . first gate drive circuit, 20 . . . second gate drive circuit, 11, 21 . . . drive circuit, 21, 22 . . . short circuit current interruption circuit, 13, 23 . . . switching circuit, 50, 50a . . . short circuit detector, 40, 40a . . . Rogowski coil, 102 . . . AC output terminal, 103P, 103Pa . . . first current path, 103N, 103Na . . . second current path, 30 . . . detection circuit, 31 . . . induced voltage detection circuit, 32 . . . determination circuit, 33 . . . comparison circuit, 34 . . . OR gate, 210, 220, 300, 300a . . . semiconductor module, 210p, 220p . . . package, 211-213, 221-223 . . . terminal, 240, 320, 320a . . . circuit board, 243, 340, 340a . . . Rogowski coil, 241, 341 . . . spiral coil, 242, 342 . . . return wire, 311-313 . . . spacer, 320 . . . circuit board, 330 . . . drive control circuit section, 361-363 . . . terminal portion, 361a-363a . . . conductor layer, 370 . . . element region, 230 . . . gate wiring board, 240 . . . Rogowski key wiring board, 250 . . . main circuit wiring board.

What is claimed is:

1. A short circuit detector that is included in a power converter, the power converter being configured to supply power to a load via a first arm including a first semiconductor switch and a second arm including a second semiconductor switch, the short circuit detector comprising:
   a Rogowski coil; and
   a detection circuit configured to detect a short circuit in one of the first arm, the second arm and the load, based on a detection signal obtained from the Rogowski coil,
   wherein the Rogowski coil is inserted into both:
   a first current path through which a first current flows in common with the first arm and the load, and
   a second current path through which a second current flows in common with the second arm and the load.

2. The short circuit detector according to claim 1, wherein:
   the first arm and the second arm are connected in series with each other, and are between a high power line and a low power line,
   the load is connected to a common connection point for the first arm and the second arm,
   the first current path is between the first arm and the common connection point, and
   the second current path is between the second arm and the common connection point.

3. The short circuit detector according to claim 2, wherein:
   the first arm is inside a first semiconductor module that includes a terminal connectable to the common connection point,
   the second arm is inside a second semiconductor module that includes a terminal connectable to the common connection point, and
   the terminal of the first semiconductor module and the terminal of the second semiconductor module are surrounded by the Rogowski coil.

4. The short circuit detector according to claim 1, wherein:
   the first arm and the second arm are connected in series with each other, and are between a high power line and a low power line,
   the load is connected to a common connection point for the first arm and the second arm,
   the first current path is between the first arm and the high power line, and
   the second current path is between the second arm and the low power line.

5. The short circuit detector according to claim 4, wherein:
   the first arm is inside a first semiconductor module that includes a terminal connectable to the high power line,
   the second arm is inside a second semiconductor module that includes a terminal connectable to the low power line, and
   the terminal of the first semiconductor module and the terminal of the second semiconductor module are surrounded by the Rogowski coil.

6. The short circuit detector according to claim 4, wherein:
   the first arm and the second arm are inside a semiconductor module,
   the high power line and the low power line are outside the semiconductor module,
   the first arm is connected to the high power line via the first current path,
   the second arm is connected to the low power line via the second current path,
   the high power line and the low power line are adjacent to each other outside the semiconductor module, and
   the first current path and the second current path are surrounded by the Rogowski coil.

7. The short circuit detector according to claim 4, wherein:
   the first arm, the second arm, the first current path and the second current path are inside a semiconductor module,
   the high power line and the low power line are outside the semiconductor module,
   the first arm is connected to the high power line via the first current path,
   the second arm is connected to the low power line via the second current path,
   the Rogowski coil is embedded in the semiconductor module, and
   the first current path and the second current path are surrounded by the Rogowski coil.

8. The short circuit detector according to claim 1, wherein the detection circuit is configured to detect a short circuit in the first arm or the second arm, based on a duration in which an absolute value of the detection signal is less than a first threshold.

9. The short circuit detector according to claim 1, wherein the detection circuit is configured to detect a short circuit when an absolute value of the detection signal is the second threshold or more.

10. The short circuit detector according to claim 1, wherein the detection circuit is configured to stop driving the first semiconductor switch of the first arm and the second semiconductor switch of the second arm.

11. A power converter that supplies power to a load, comprising:
    a first arm that includes a first semiconductor switch;
    a second arm that includes a second semiconductor switch;
    a first current path through which a first current flows in common with the first arm and the load;
    a second current path through which a second current flows in common with the second arm and the load; and
    a short circuit detector,
    wherein the short circuit detector includes:
    a Rogowski coil that is inserted into both the first current path and the second current path; and
    a detection circuit configured to detect a short circuit in one of the first arm, the second arm and the load, based on a detection signal obtained from the Rogowski coil.

* * * * *